United States Patent [19]

Wooten

[11] Patent Number: 4,608,274
[45] Date of Patent: Aug. 26, 1986

[54] METHOD OF MANUFACTURING CIRCUIT BOARDS

[75] Inventor: Jack Wooten, Mountain View, Calif.

[73] Assignee: Faultless PCBS, Redwood City, Calif.

[21] Appl. No.: 405,887

[22] Filed: Aug. 6, 1982

[51] Int. Cl.[4] .............................................. B05D 3/06
[52] U.S. Cl. ..................................... 427/96; 156/625; 156/902
[58] Field of Search ................... 427/96, 97; 156/902; 29/852

[56] References Cited

U.S. PATENT DOCUMENTS

| | | |
|---|---|---|
| 3,169,063 | 2/1965 | Johnston et al. . |
| 3,282,755 | 11/1966 | Tischler . |
| 3,620,933 | 11/1971 | Grunwald et al. . |
| 3,673,680 | 7/1972 | Tanaka et al. . |
| 3,702,284 | 11/1972 | Merkenschlager . |
| 3,742,597 | 7/1973 | Davis . |
| 3,772,101 | 11/1973 | Chumbres et al. . |
| 4,075,757 | 2/1978 | Malm et al. . |
| 4,104,111 | 8/1978 | Mack . |

Primary Examiner—John H. Newsome
Attorney, Agent, or Firm—Jack M. Wiseman

[57] ABSTRACT

Printed circuit boards are fabricated by screening circuit and pad-defining patterns on a base panel and removing them in a certain sequence, and depositing metal in the pad areas only at a particular interval in the process, the sequence being effective to facilitate inspection of the board at desired intervals and to produce accurate, economical circuit boards.

7 Claims, 11 Drawing Figures

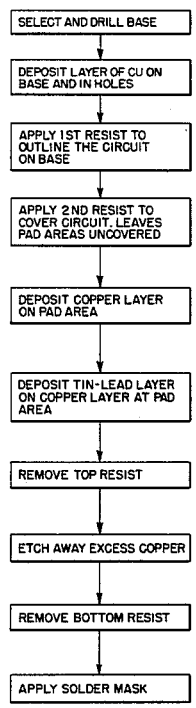

FIG_1

- SELECT AND DRILL BASE
- DEPOSIT LAYER OF CU ON BASE AND IN HOLES
- APPLY 1ST RESIST TO OUTLINE THE CIRCUIT ON BASE
- APPLY 2ND RESIST TO COVER CIRCUIT. LEAVES PAD AREAS UNCOVERED
- DEPOSIT COPPER LAYER ON PAD AREA
- DEPOSIT TIN-LEAD LAYER ON COPPER LAYER AT PAD AREA
- REMOVE TOP RESIST
- ETCH AWAY EXCESS COPPER
- REMOVE BOTTOM RESIST
- APPLY SOLDER MASK

 FIG_2A

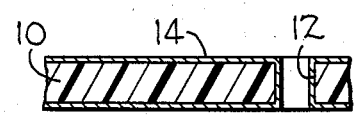 FIG_2B

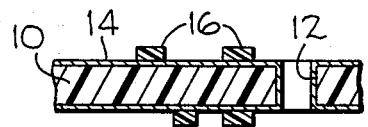 FIG_2C

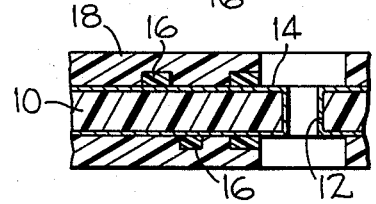 FIG_2D

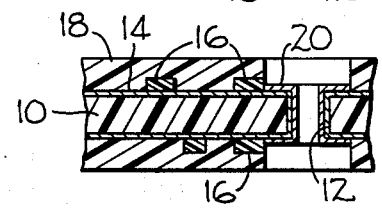 FIG_2E

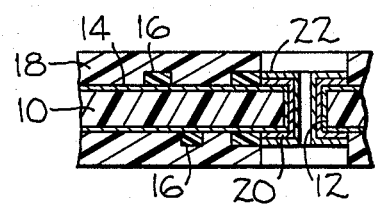 FIG_2F

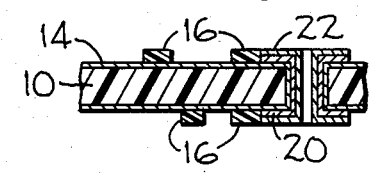 FIG_2G

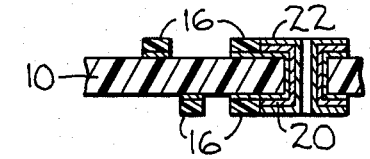 FIG_2H

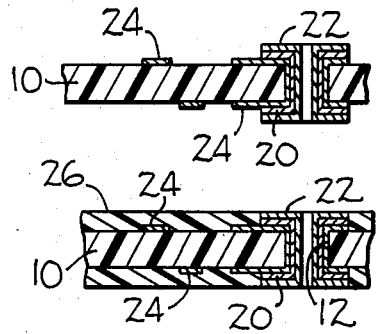 FIG_2J

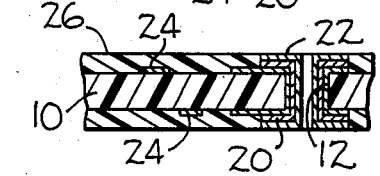 FIG_2K

METHOD OF MANUFACTURING CIRCUIT BOARDS

BACKGROUND OF THE INVENTION

This invention relates to improvements in printed circuits and more particularly concerns an improved process of manufacturing printed circuit boards.

Printed circuit boards are widely used and several different methods have been proposed for manufacturing the boards. A technique used in many of these manufacturing processes involves the screening of plating resist onto a base panel to define circuit traces and areas on the panel at which connection pads and through holes are to be formed. The resist may be deposited on the panel in both negative and positive formation depending upon the sequence of steps being followed. The present invention involves the use of a novel sequence of resist-applying, metal-depositing, and resist-removing steps which results in a printed circuit in which the amount of metal deposited on the panel to form and protect the circuitry is minimized. Further, the improved method facilitates accurate inspection of the circuit during the manufacturing process and makes it possible to inspect the circuitry in a manner that is efficient from both a time-consuming and an accuracy viewpoint.

Some of the above-mentioned prior art techniques are disclosed in the following patents: U.S. Pat. No. 3,702,284 to Merkenschlager; U.S. Pat. No. 3,742,597 to Davis; U.S. Pat. No. 3,772,101 to Chambres et al.; and U.S. Pat. No. 4,101,111 to Mack. However, the method of the present invention involves a sequence of steps which is not disclosed in these patents and which features the formation of a positive image of the desired circuit in resist at an early stage of the process to make circuit inspection and touch-up an efficient and accurate operation. In addition, after the circuit is defined, no extra metal is deposited on the circuit during the entire process, and thus added plating steps, which can result in defective panels and the reworking of the circuits, are avoided. Other and further features and advantages of the method will be apparent from the following description of a preferred embodiment of the invention.

SUMMARY OF THE INVENTION

A method of producing printed circuits involves in part the forming of a positive image of a circuit on a copper clad base panel by means of a plating resist, applying a second layer of resist to cover the circuit image and define pad areas, depositing suitable metal layers on the base in the pad areas, removing the second layer of resist to expose the copper on the base panel around the circuit image provided by the first resist, etching away the exposed copper on the panel, and then removing the first resist to uncover the circuit defined in the copper layer of the base.

DESCRIPTION OF THE DRAWINGS

FIG. 1 is a table showing the sequence of steps used in preparing a circuit board in accordance with the teaching of the present invention.

FIGS. 2A-2K are schematic showings of sections through a circuit board at consecutive intervals during the formation of a circuit and associated elements on a base panel.

DESCRIPTION OF A PREFERRED EMBODIMENT

In the embodiment of the present invention illustrated in diagrammatic form in FIG. 2, various layers of material are shown as being sequentially deposited on and removed from both sides of a base panel to produce a board having a desired circuit formed thereon. The showings of the various elements, particularly the thickness of the layers of material, are exaggerated and are not shown in their true relationship with reference to each other or with reference to the base panel to more clearly illustrate the method. Further, the circuit portions shown are not part of a circuit having any known use.

In preparing a circuit board in accordance with the present invention, one of the initial steps is the preparation of a circuit master and a pad master. The circuit master consists of a graphic layout, as by means of tape, of the circuit at a relatively large scale. In the board of FIG. 2, circuit elements are to be formed on both sides of the base panel 10, and therefore a separate circuit master must be prepared for each side. The pad master consists of a graphic showing of the locations at which holes are to be drilled to interconnect circuitry on one side of the base 10 with circuitry on the other side, and the locations of points where components are to be mounted. From the tape-ups, a positive reproduction of the two circuits and a negative reproduction of the pad locations are obtained. If the pad areas on each side of the board have identical locations, a single pad master may be sufficient for both sides but if the pattern of pad areas is different for each side, two pad masters will be necessary. All three copies are reduced photographically to correct size and working copies are made of the reduced pad and circuit masters.

Next, an appropriate base panel or mounting board 10 on which the circuit elements are to be laminated is selected. This board may be formed of a dielectric plastic material, such as an epoxy resin, and have a size, configuration, and thickness suitable for the proposed use of the circuit board. After the board has been selected, it is drilled to provide through-holes 12 in the pattern outlined in the pad master if a two-sided circuit board is to be produced.

The board is then sanded and processed through an electroless plating line to deposit a thin layer 14 of copper (FIG. 2B) on both sides of the board and on the walls of the holes 12. Since parts of the copper layer 14 will form the major portions of the final circuit of the circuit board, the thickness of this layer is determined by the current-carrying needs of the circuit.

Using the positive circuit masters, a screening stencil is produced for the circuits of each side of the board on stainless steel mesh suitable for copper screening. In each stencil the image of the circuit is a negative image. The stencils are put into place and both sides of the board are screened using Wornow PR-1000 resist. The Wornow PR-1000 resist, which is referred to in U.S. Pat. No. 4,104,111, is a modified vinyl that is chemically strippable without damage to the underlying copper. The Wornow PR-1000 resist is a wellknown resist manufactured by the Hysol Division of The Dexter Corporation. The resist penetrates the stencil and is deposited on the boards in patterns corresponding to the circuit patterns outlined by the stencil as indicated at 16 on FIG. 2C. The board with the resist circuit patterns is then baked at 225° F. for 15 minutes to solidify the resist 16 on both sides of the board.

Using the negative pad master, a stainless steel copper screening stencil is produced. In this stencil, the pad images are positive images. Both sides of the board are screened using Wornow PR-5050 resist to deposit a layer 18 (FIG. 2D) covering the entire board, including the circuit image 16 but not covering the pad areas. Wornow PR 5050 is a well-known alkaline-soluable plating resist manufactured by the Hysol Division of The Dexter Corporation. The board is again baked at 225° F. for 15 minutes to solidify layer 18.

Next, the board is prepared for an electroplating operation following standard procedure, and then a layer 20 (FIG. 2E) of copper is electroplated onto the pad areas. This is accomplished by placing the board in an acid copper bath with suitable current flow, such as 30 amps sq. ft. of plating area, for approximately 20 minutes.

After the copper plating, the board is prepared using standard procedures for a tin-lead plating operation. Then a layer 22 (FIG. 2F) of tin-lead is electroplated onto the copper layer 20 in the pad areas by plating in a tin-lead bath at 15 amps sq. ft. of plating area for approximately 8 minutes.

The top layer 18 of resist is stripped using AP610 resist stripper, and the board is thoroughly rinsed. The top layer 18 of resist is stripped in a well-known manner using an alkaline solution. The AP610 resist stripper is a well-known alkaline base stripper manufactured by Inland Specialty Chemical. As seen in FIG. 2G, the entire copper layer 14 is now exposed except at that part which is under the resist layer 16 and at the pad areas. In the next step of the procedure, the entire exposed part of the copper layer 14 is etched away, leaving the base 10 exposed at all areas except those covered by the resist layer 16 and those in the pad area, as indicated in FIG. 2H.

The bottom resist layer 16 is then removed using acetone or an equivalent solvent stripper. After this stripping operation, the only copper remaining on each side of the board is the circuit 24 and the layers of metal deposited at the pad areas, as seen in FIG. 2J. The board is thoroughly rinsed off, scrubbed and inspected.

In the final steps in the procedure, a shield 26 of an insulating epoxy material is deposited on each side of the base using a suitable screen, and the panel is immersed in a LT26 hot tin bath to cover any circuit tabs that may project into the pad area.

The foregoing description applies to a board in which a plurality of coated through holes are provided to connect circuit elements on one side with circuit elements on the other side. It is evident that the method of the present invention can be employed to manufacture boards having circuits on only one side. In this case the pad areas will be those areas at which components are to be connected. Accordingly in the claims, the term "pad" will be used to indicate the areas at which through holes are located and the areas at which components are to be connected.

It is to be noted that, as indicated in FIG. 2C, the first screening results in a positive outline of the circuit in resist and it is this image that is inspected for discontinuities, voids and bridges between circuits. Inspection of a negative for these miniscule circuit imperfections is a detailed, exacting process which is made easier in the process of the present invention, because the circuit stands out in bold relief on a clear background, than it would be if it were a conventional negative image. Also, it will be evident that, while conventional processes involve plating over the circuit elements with copper and tin/lead, the present process does not cause any metal to be deposited over circuit 24 and thus a considerable amount of metal is saved during the manufacture of each board.

I claim:

1. In a process of manufacturing a circuit board the steps of selecting a base panel of insulative material, drilling holes through said panel at predetermined areas, depositing a layer of copper on both sides of said base panel and in the walls defining said holes, preparing a screen with a negative image of the desired circuit thereon for each side of said panel, screening a first resist onto each side of said panel to form a positive circuit image thereon, heating said panel to solidify the resist image, preparing a screen with a positive image of the pad areas for each side of the panel, screening a second resist onto each side of the panel to cover the positive circuit images thereon and to cover all other parts of the panel except the pad areas, heating the panel to solidify the resist, depositing a layer of copper on the panel at each pad area, depositing a tin/lead layer above the copper layer at each pad area, removing the top resist on each side of the panel while leaving the positive circuit images of first resist in place and exposing the panel around the positive circuit images, etching away the excess copper on said panel, and removing said bottom resist to expose the circuit outlined therebelow in copper on both sides of said panel.

2. In a process of manufacturing circuit boards, the steps of,
   A. providing a copper clad base panel,
   B. forming a positive pattern of first plating resist on said panel corresponding to the desired circuit,
   C. forming a layer of second plating resist on said panel to cover the circuit image and the exposed copper surface of the panel except at one or more pad areas,
   D. depositing conductive metal on the copper surface at said pad areas,
   E. depositing a tin/lead layer on the conductive metal in said pad areas,
   F. removing the layer of second resist while allowing the circuit-defining image of first resist to remain in place,
   G. etching away the exposed copper on said base panel, and
   H. applying a mask over the exposed surface of the panel and over the copper circuit.

3. A process according to claim 2 wherein said panel-producing step includes the steps of selecting a base panel of insulative material, drilling a pattern of through-holes in said panel, and depositing a layer of copper on both surfaces of said panel and on the cylindrical surfaces defining said through-holes.

4. A process according to claim 2 wherein the forming of a positive image pattern of the circuit on said panel includes the steps of preparing a screen on which the circuit is a negative image, screening Wornow PR-100 resist onto said panel to form the positive image, and heating the panel to solidify the resist.

5. A process according to claim 2 wherein the forming of a layer of second resist on said panel includes the steps of preparing a screen on which pad areas are presented as positive images, screening Wornow PR-5050 onto the panel to cover the positive image of the circuit and to cover all other areas of the panel except the pad areas and heating the panel to solidify the second resist.

6. A process according to claim 2 wherein the removing of the layer of second resist includes the step of applying AP610 resist stripper to the panel.

7. A process according to claim 2 further comprising the step of applying a layer of hot tin over said mask to cover projecting circuit tabs.

* * * * *